United States Patent [19]

Bowers

[11] Patent Number: 4,757,274
[45] Date of Patent: Jul. 12, 1988

[54] INPUT COMPENSATION CIRCUIT FOR SUPERBETA TRANSISTOR AMPLIFIER

[75] Inventor: Derek F. Bowers, Sunnyvale, Calif.

[73] Assignee: Precision Monolithics, Inc., Santa Clara, Calif.

[21] Appl. No.: 3,069

[22] Filed: Jan. 14, 1987

[51] Int. Cl.$^4$ .............................................. H03F 3/45
[52] U.S. Cl. .................................... 330/257; 330/261
[58] Field of Search ................ 330/257, 261; 307/352, 307/353

[56] References Cited

U.S. PATENT DOCUMENTS 4,263,562  4/1981  Seiler ................................... 330/257
4,471,321  9/1984  Bowers ................................. 330/261

Primary Examiner—James B. Mullins
Attorney, Agent, or Firm—Koppel & Harris

[57] ABSTRACT

An improved input current compensation circuit is provided for a dual branch amplifier, particularly an amplifier employing superbeta transistors. The compensation circuit has a superbeta compensation transistor which is matched with the superbeta amplifier transistors, a bipolar transistor connected across the superbeta transistor in a manner analogous to a voltage limiting circuit in the amplifier section, and current sources which provide operating currents to both the superbeta and bipolar compensation transistors. The base current of the superbeta compensation transistor is mirrored to the bases of the superbeta amplifier transistors, and the superbeta transistors, bipolar transistor and current sources in the compensation section are scaled relative to corresponding elements in the amplifier section so that the superbeta amplifier transistor base currents are substantially compensated by current mirrored from the compensation circuit. A negative feedback circuit is provided to keep the superbeta compensation transistor in its linear operating region, and current sources in the compensation section are selected to mitigate second-order errors.

16 Claims, 4 Drawing Sheets $I = I_1 = I_2 = I_3 = I_4$

INPUT COMPENSATION CIRCUIT FOR SUPERBETA TRANSISTOR AMPLIFIER

BACKGROUND OF THE INVENTION

1. Field of the Invention

This invention relates to electric amplifier circuits, and more particularly to amplifiers employing superbeta transistors.

2. Description of the Prior Art

"Superbeta transistors" are provided with very lightly doped bases or have their emitters driven heavily into their bases to achieve high gains, typically in the order of 1,000–5,000. Amplifiers with superbeta transistors are capable of achieving a higher degree of amplification than would otherwise be attainable. However, the use of such transistors introduces certain control problems that are not present with lower gain transistors. An accurate mechanism to compensate for amplifier input bias currents has been a particular source of concern.

FIG. 1 shows a typical prior art instrumentation amplifier with conventional transistors and a known input current compensation circuit. The amplifier consists of amplifying transistors Q1 and Q2 with inputs 1 and 2 connected respectively to their bases, current sources I1 and I2 providing current respectively to Q1 and Q2, and resistor R connected across the emitters of the two transistors. The transistor emitters are shown connected to a voltage-to-current converter 4, while their collector outputs may be connected to a second amplifier stage. The base currents of Q1 and Q2 introduce undesirable amplifier input currents. In order to provide a compensation current which eliminates the effects of the input bias currents, an additional transistor Q3 identical to Q1 and Q2 is provided. A current source I3, which is equal to both I1 and I2, is connected to the emitter of Q3 so that the current through Q3 will be approximately equal to that through Q1 and Q2, with the collector of Q3 connected to a positive voltage bus.

The base of Q3 is connected to a current mirror consisting of common base connected transistors Q4, Q5 and Q6. Q6 is a diode-connected device which provides the base current of Q3, while Q4 and Q5 are respectively connected to inputs 1 and 2. Since Q1, Q2 and Q3 are matched and operate at substantially the same emitter currents, their base currents are approximately equal. The base current of Q3 is reflected back through the current mirror and is combined with the base currents of Q1 and Q2. The result is an approximate cancellation of input currents.

A problem can arise if Q1 and Q2 are replaced by superbeta transistors, since the collector breakdown of such devices is only a few volts. A prior art circuit which attempts to solve this problem is shown in FIG. 2. This circuit is an extension of one employed in the OP-27 operational amplifier produced by Precision Monolithics, Inc. of Santa Clara, Calif., the assignee of this application. The circuit substantially overcomes the collector breakdown problem of amplifier transistors Q1 and Q2 noted above by the addition of voltage limiting transistor circuits Q7, Q8, Q9, and Q10, Q11, Q12 connected across the collector-emitter circuits of Q1 and Q2, respectively. Q8 and Q11 are respectively connected in series with Q1 and Q2 and their respective current sources I1 and I2. The other transistors in the voltage limiting circuits are connected to add two base-emitter drops between the bases of Q8 and Q11 and the emitters of Q1 and Q2, respectively. A second set of current sources I4 and I5 respectively supply current to the bases of Q8 and Q11 and to the remainder of the voltage limited circuitry, thereby maintaining the collector-base voltages of Q1 and Q2 at close to zero volts.

A pair of compensation transistors Q13 and Q14 perform a function comparable to that of Q3 in FIG. 1. The bases of Q13 and Q14 are connected in common and, when current is drawn through these compensation transistors by emitter-connected current sources I6 and I7, the magnitudes of which are equal to I1 and I2, a bias current flows into Q13 and Q14 to compensate for the input base current of Q1 and Q2. A control transistor Q15 is connected with its collector-emitter circuit between the bases of Q13, Q14 and Q6 of the current mirror to control the base potentials of Q13 and Q14.

An output for a second amplifier stage is provided from transistors Q16 and Q17, which have their collectors connected together, their bases connected respectively to the outputs of I1 and I2, and their emitters connected to the collectors of Q13 and Q14 through transistors Q18 and Q19, respectively. The latter two transistors have a common base connection and maintain the collector-base voltages of Q13 and Q14 close to zero volts, as the voltage limiting circuits described above do for Q1 and Q2. The circuit of FIG. 2 has been found to resolve the collector breakdown problem. However, difficulties have been encountered in making the circuit work accurately because the very low Early voltage of the superbeta transistors (defined as output impedance multiplied by collector current) causes the base currents to vary significantly with changes in collector-base voltage. In theory this could be overcome by adjusting the potential between the biases for Q15 and Q18, Q19 until the collector-base voltages of Q13 and Q14 match those of Q1 and Q2. In practice, however, this is quite different to accomplish because the optimum bias voltage is a function of the Q15 base-emitter voltage, which is poorly defined since the base currents of Q13 and Q14 are not precisely known. The low initial Early voltage of the superbeta transistors thus introduces errors in the input current compensation.

An improved circuit which achieves a high degree of accuracy despite the transistors' Early voltage, and which also avoids slow discharge nodes, is disclosed in U.S. Pat. No. 4,471,321, issued to the present inventor on Sept. 11, 1984 and assigned to Precision Monolithics, Inc., the assignee of the present invention. In this patent, an input current compensation circuit of the type illustrated in FIG. 2 is improved by the addition of a multi-transistor voltage control circuit connected across the compensation transistors to control the collector-emitter voltages thereof. The voltage control circuit is matched with the current limiting circuit for the amplifier transistors. A current source arrangement is matched with the current source for the voltage limiting circuit, and connected to induce a current flow through the voltage control circuit such that the collector-base voltages of the superbeta transistors and the compensation transistors are substantially equal. An accurate input current cancellation for the amplifier is thereby achieved. While the disclosed circuit is indeed an improvement, it is somewhat complicated and is still not totally accurate.

SUMMARY OF THE INVENTION

In view of the above problems associated with the prior art, the object of the present invention is the provision of a novel and improved input current compensation circuit for a dual branch amplifier, particularly one employing superbeta transistors, which achieve a high degree of accuracy despite the transistors' Early voltage, and is relatively uncomplicated.

In the accomplishment of these and other objects of the invention, the compensation circuit employs a single superbeta transistor which is matched with the superbeta amplifier transistors. A circuit device, preferably a bipolar transistor, is connected to limit the collector-emitter voltage of the superbeta compensation transistor to prevent its collector breakdown, while a current source directs collector-emitter current through the superbeta compensation transistor to generate a base current therein. Another current source supplies current to the bipolar compensation transistor and to the other side of the superbeta compensation transistor's collector-emitter circuit. The various current sources and bipolar transistors of the amplifier and compensation circuits are scaled so that the base currents of the superbeta amplifier and compensation transistors are substantially matched. The base current for the superbeta compensation transistor is directed through the current mirror to the bases of the superbeta amplifier transistors, thereby substantially compensating for their respective base currents.

In the preferred embodiment, a feedback circuit between the base and emitter of the superbeta compensation transistor keeps that device in its linear operating region. The feedback circuit includes two bipolar transistors, one with its collector-emitter circuit providing a connection between the current mirror and the base of the superbeta compensation transistor, and the other with its collector-emitter circuit connected to the base of the first feedback transistor and its base connected to the emitter of the superbeta compensation transistor. The feedback circuit also includes a current source for its two bipolar transistors, the magnitude of the current source being selected to reduce second order errors stemming from the base currents of the two feedback transistors. The magnitudes of other current sources and bipolar transistors in the amplifier and compensation circuits are also selected to reduce second order errors.

These and other features and objects of the invention will be apparent to those skilled in the art from the following detailed description of the preferred embodiments, taken together with the accompanying drawings, in which:

DETAILED DESCRIPTION OF PREFERRED EMBODIMENTS

Figure 3:
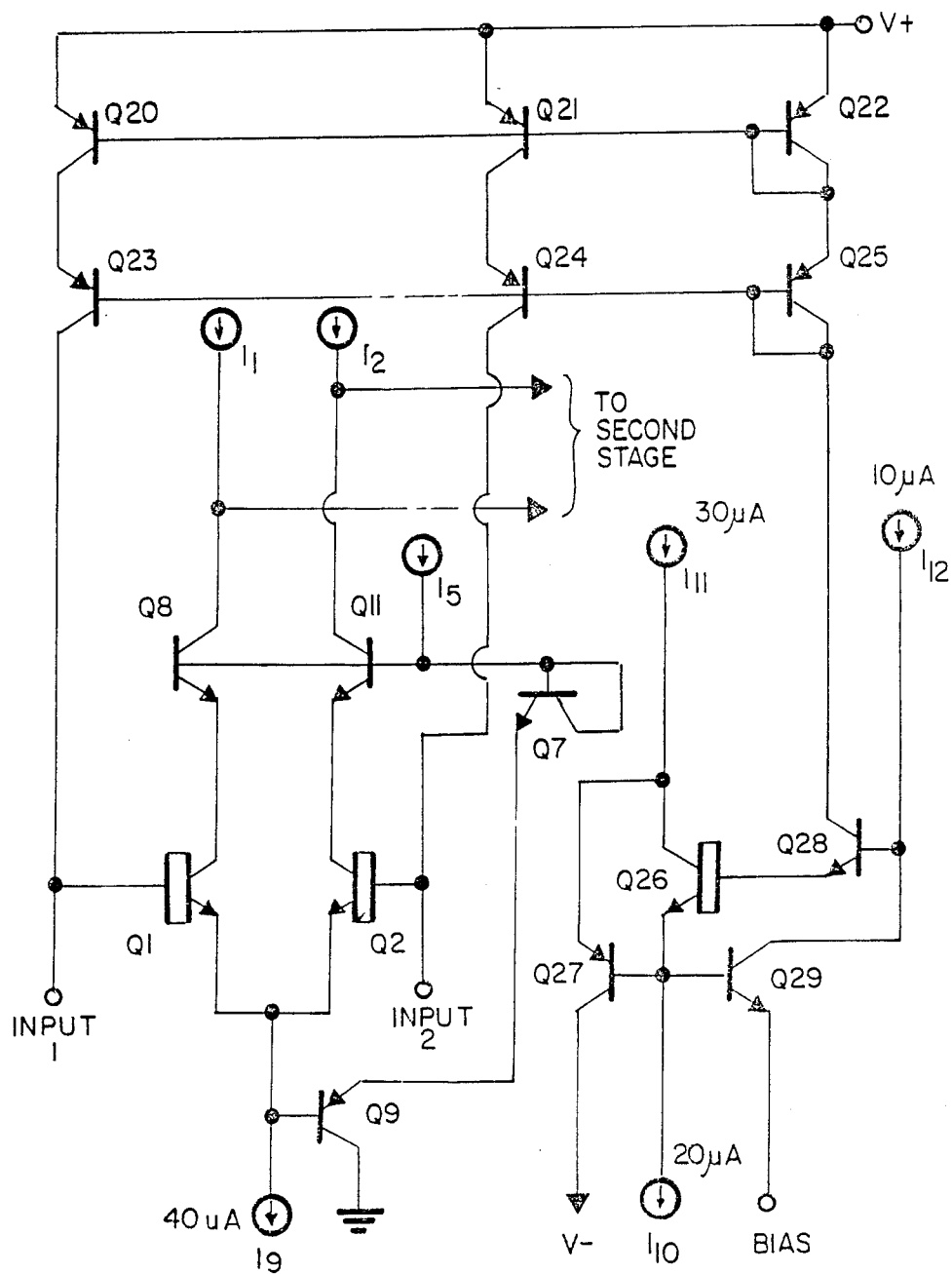
FIG. 3 is a schematic diagram of the improved compensation circuit of the present invention as applied to an operational amplifier.

A preferred embodiment of the invention is shown in FIG. 3. In this figure the same reference numerals are retained from the previous figures of prior art circuits for common elements. While connections between specific transistors in both this specification and the appended claims are described in terms of the transistor polarities shown in the accompanying drawings, it should be understood that the invention is equally applicable to transistors of opposite polarity.

The amplifier portion of the circuit, to the left of the dashed line, is interconnected with the input current compensation portion of the circuit to the right of the dashed line by an improved current mirror formed by transistors Q20–Q25. This mirror circuit, in which the collector voltages of Q23, Q24, and Q25 are kept the same so as to increase the mirror's accuracy, was employed in a prior art device and forms no part of the present invention.

The amplifier portion of the circuitry is the same as that shown for an operational amplifier in the referenced U.S. Pat. No. 4,471,321. A single voltage limiting circuit consisting of transistors Q7, Q8, Q9 and Q11 is connected across the collector-emitter circuits of both superbeta amplifier transistors Q1 and Q2. The base of Q9 is connected in common to the emitters of Q1 and Q2, thereby setting the base voltage of Q9 equal to the emitter voltages of Q1 and Q2. Tracing the circuit from this common connection, it can be seen that the bases of Q1 and Q2 are each one base-emitter voltage level above the base of Q9. Tracing the circuits from Q9 through Q7, Q8 and Q11 to the collectors of Q1 and Q2, the emitter of pnp transistor Q9 is one-base emitter voltage level above the Q9 base voltage; the base of npn transistor Q7 is raised another base-emitter voltage level above the base of Q9; and the emitters of Q8 and Q11 are down one base-emitter voltage level from the base of Q7 (assuming all the devices are "on"). Thus, the collector-emitter voltages of Q1 and Q2 will be limited to about one-base emitter voltage level.

Referring to the compensation circuit to the right of the dashed line, a superbeta transistor Q26 is provided which is matched with transistors Q1 and Q2 in the amplifier circuit. The collector-emitter voltage of superbeta transistor Q26 is limited by a pnp bipolar transistor Q27 that has its emitter connected to the collector of Q26, and its base connected to the emitter of Q26. A current source I10 is connected to the emitter of Q26 and base of Q27 to draw current through Q26, while another current source I11 is connected to the collector of Q26 and the emitter of Q27 to provide current to both transistors. The collector of Q27 is connected to the negative voltage bus. The current sources I5, I9, I10 and I11, the superbeta transistors Q1, Q2 and Q26, and the bipolar transistors Q9 and Q27 are mutually scaled so that a base current is generated in the superbeta compensation transistor Q26; this base current is reflected by the mirror to the inputs of the superbeta amplifier transistor Q1 and Q2 to effectively compensate for their input currents.

The base of superbeta compensation transistor Q26 is connected to drive the current mirror by means of a bipolar transistor Q28, the emitter of Q28 being connected to the base of Q26 and the collector of Q28 connected to the mirror. Q28 is also connected with another bipolar transistor Q29 in a negative feedback loop that causes the potential at the base of Q26 to establish itself at a correct voltage to ensure that Q26 is maintained in its linear operating region. The base of Q28 is connected to the collector of Q29, while the base of Q29 is connected to the emitted of Q26. A current source I12 provides base current to Q28 and collector current to Q29, the emitter of which is connected to a suitable bias level.

While superbeta compensation transistor Q26 is preferably identically matched with superbeta amplifier transistors Q1 and Q2 so that the Q26 base current equals the absolute value of the Q1 and Q2 base currents, Q26 could also be proportionately matched with Q1 and Q2, and the other circuit values adjusted to provide the same effect. For example, if the base current of Q26 were half that of Q1 and Q2, either the current mirror could be adjusted so that it reflected twice the value of the Q26 base current to the superbeta amplifier transistors, or other elements of the circuit could be adjusted so that the Q26 base current was effectively doubled as seen by the bases of Q1 and Q2. The important point is that the base current of Q26 be a fixed and defined proportion of the Q1 and Q2 base currents.

Since the current of I9 is divided between Q1 and Q2, the magnitude of I9 is made twice as great as that of I10. So long as the magnitude of I11 is sufficiently greater than that of I10, current will flow through both Q26 and Q27 and the collector-emitter voltage of Q26 will equal the base-emitter voltage of Q27. By a suitable scaling of I11, I5, Q9 and Q27, the base-emitter voltages of Q9 and Q27 are made substantially identical (with those devices "on"). The base-emitter voltages of Q7, Q8 and Q11 are likewise matched so that the collector-emitter voltages of Q1 and Q2 are equal to the base-emitter voltage of Q27; the collector-emitter voltages of the superbeta amplifier transistors Q1 and Q2 are thus equal to the collector-emitter voltage of superbeta compensation transistor Q26.

Q1, Q2 and Q26 thus have essentially the same collector currents and the same collector-emitter voltages. Accordingly, they have substantially equal base currents. The Q26 base current is captured by Q28 and fed to the current mirror for reinjection into the bases of Q1 and Q2 via mirror transistors Q23 and Q24. The value of I11 is not critical so long as it sufficiently exceeds I10. Suitable current magnitudes for the various current sources are 20 microAmps for I5, 40 microAmps for I9, 20 microAmps for I10, 30 microAmps for I11, and 10 microAmps for I12.

The compensation circuit as described thus far has some second-order errors which can be effectively cancelled by a proper selection of I11 and I12. The first error stems from the fact that the base current of bipolar transistor Q27 flows into I10, and thus reduces the effective value of I10 in drawing current through superbeta compensation transistor Q26. However, the base current of bipolar transistor Q9 in the amplifier circuit similarly reduces the effective value of I9. Since the current magnitude of I10 is half that of that of I9, the error can be cancelled by making the current in Q27 half that of the current in Q9. This is accomplished by setting I11 to exceed I10 by half the current magnitude of I5. Also, Q9 is scaled twice as large as Q27 so that the base-emitter voltages of these two bipolar transistors match.

Two other second-order errors can also be accounted for. The first is that the base current of Q29 adds to the effective magnitude of I10, and the second is that the base current of Q28 does not reach the current mirrors. These two errors are dependent upon the current gain of the NPN transistors, but are in opposite directions. They can be made to cancel by setting the collector current of Q29 equal to I10. This is achieved by making I12 equal to I10 (neglecting the base current of Q28, which is insignificant). The result is a simplified circuit that is extremely accurate in compensating for the amplifier input currents.

Figure 1:
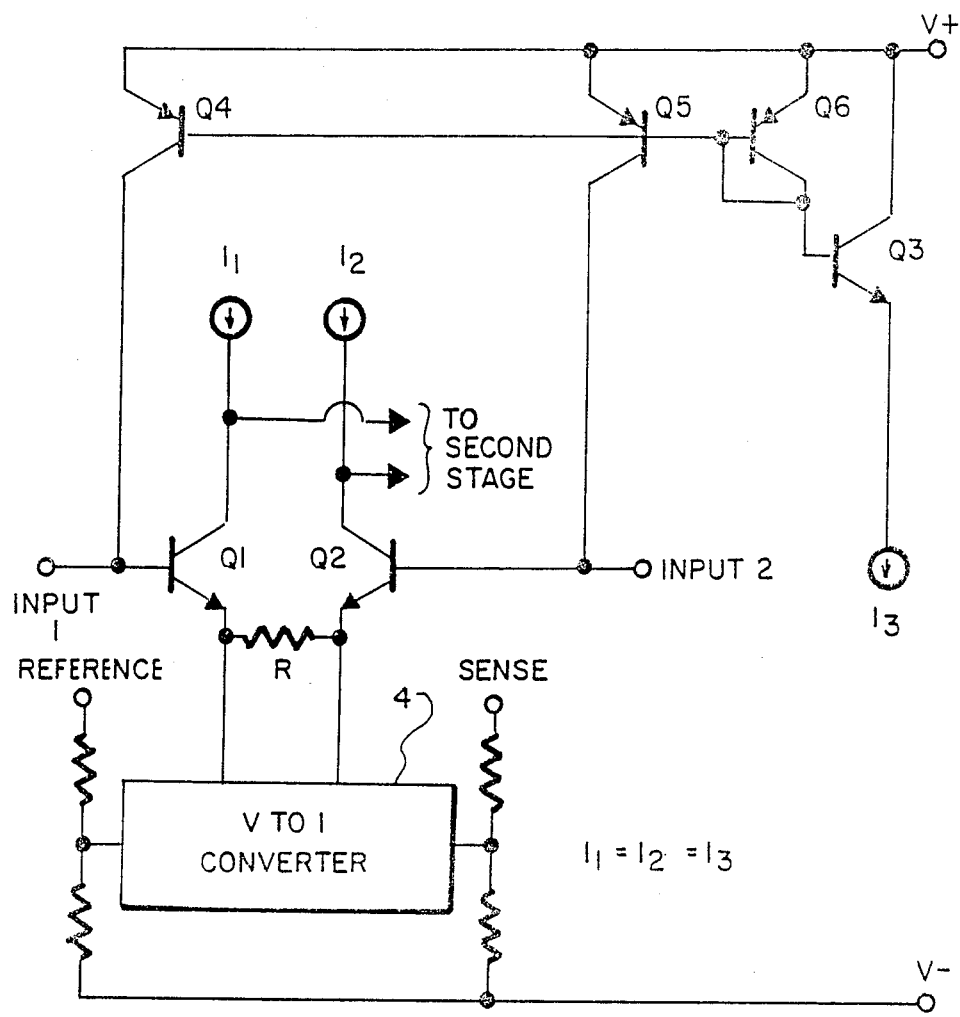
FIG. 1 is a schematic diagram of a prior art amplifier circuit employing ordinary gain transistors and a conventional input compensation circuit.
Figure 2:
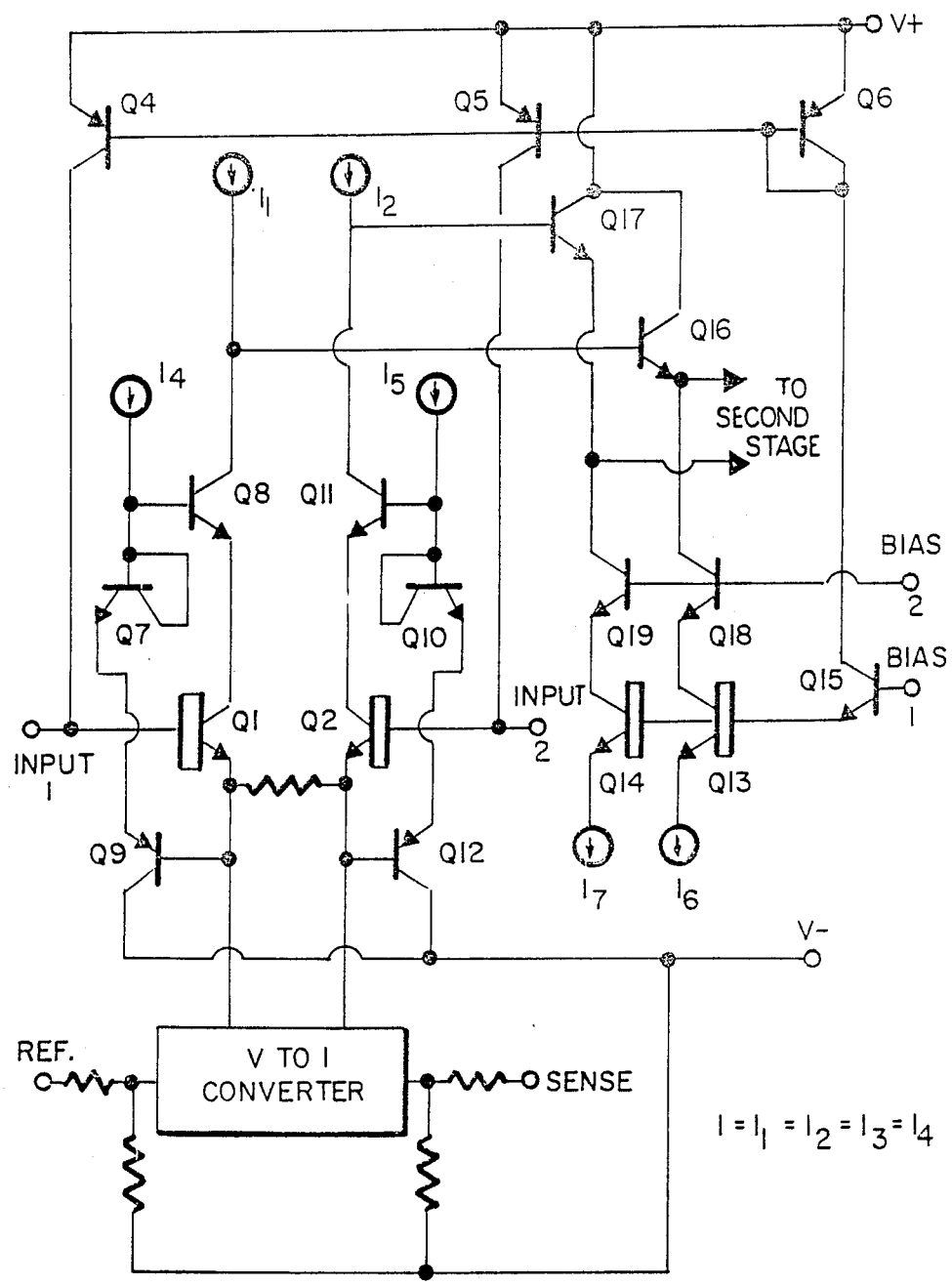
FIG. 2 is a schematic diagram of a prior art superbeta transistor amplifier circuit with input current compensation.
Figure 4:
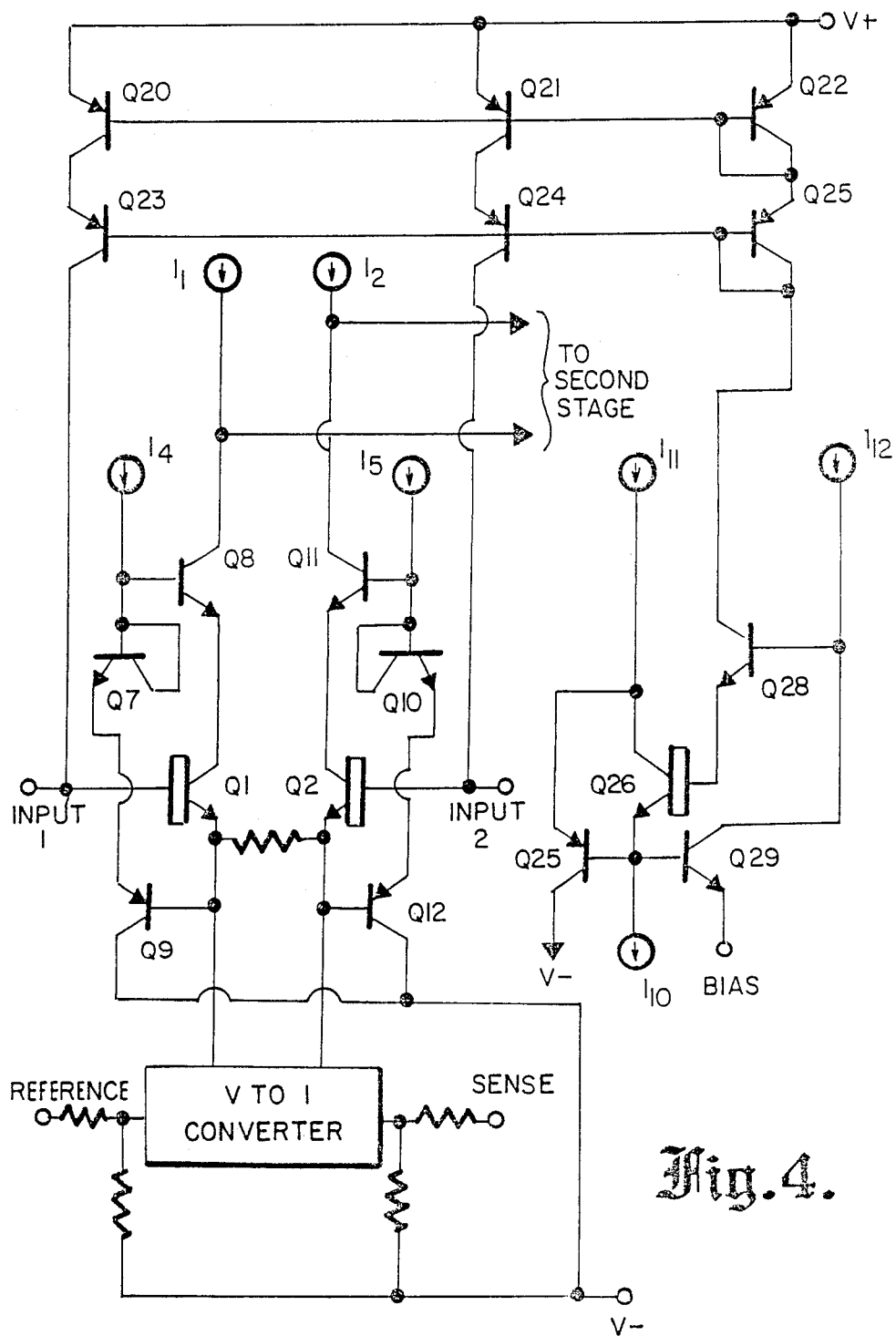
FIG. 4 is a schematic diagram of the input current compensation circuit of the present invention as applied to a differential amplifier.

The application of the invention to a differential amplifier is shown in FIG. 4. In this embodiment the voltage limiting circuit is divided into two branches, one branch Q7, Q8 and Q9 for input transistor Q1, and the other branch Q10, Q11 and Q12 for input transistor Q2. This arrangement is the same as in the prior art circuit shown in FIG. 2. The compensation approach for this amplifier circuit is the same as in the embodiment of FIG. 3, with the bipolar compensation transistor Q27 scaled in relation to Q9 and Q12, and the various compensation current sources scaled in relation to I4, I5 and the voltage-to-current converter. Thus, the description of amplifier circuit elements in the singular for the operational amplifier embodiment of FIG. 3 applies equally to the dual circuit elements for the differential amplifier for FIG. 4.

While specific embodiments of the invention has been shown and described, various modifications and alternate embodiments will occur to those skilled in the art. For example, while the greatest benefits of the invention are achieved with superbeta amplifier and compensation transistors as described, it is also applicable to dual branch amplifier circuits employing lower gain transistors. Accordingly, it is intended that the invention be limited only in terms of the appended claims.

I claim:

1. An input current compensation circuit for a dual branch amplifier having a superbeta transistor in each branch and input means connected to the base of each superbeta transistor, said circuit comprising:

a current mirror connected to supply base current to each of the amplifier superbeta transistors, a compensation superbeta transistor which is matched with the amplifier superbeta transistors, current mirror drive means connecting the base of the compensation superbeta transistor for driving the current mirror to deliver base compensation currents to the amplifier superbeta transistors which are matched with the base current of the compensation superbeta transistor, means for directing a current through the compensation superbeta transistor to generate a base current therein, and circuit means limiting the collector-emitter voltage of the compensation superbeta transistor to prevent collector breakdown of the transistor, whereby the amplifier superbeta transistors are provided with a compensated input base current without collector breakdown, said circuit means comprising a bipolar transistor having its base-emitter circuit connected across the collector and emitter of the superbeta compensation transistor.

2. The circuit of claim 1, further comprising a first current source connected to the base of the bipolar transistor and the emitter of the compensation superbeta transistor, and a second current source connected to the emitter of the bipolar transistor and the collector of the compensation superbeta transistor, the current magnitudes of said current sources being selected to supply the collector-emitter current of the compensation superbeta transistor and to keep the bipolar transistor in conduction.

3. The circuit of claim 1, said current mirror drive means comprising a first bipolar transistor having its collector-emitter circuit connected in circuit between the current mirror and the base of the compensation superbeta transistor, and means supplying base current to the first bipolar transistor.

4. The circuit of claim 3, further comprising a second bipolar transistor connected in circuit with the first bipolar transistor in a feedback circuit between the base and emitter of the compensation superbeta transistor, said feedback circuit maintaining the compensation superbeta transistor in its linear operating region.

5. In an input current compensation circuit for a dual branch amplifier of the type having a transistor in each branch; input means connected to the base of each amplifier transistor; a first current source connected to draw current through the collector-emitter circuits of the amplifier transistors; a voltage limiting circuit connected to limit the collector-base voltages of the amplifier transistors, said voltage limiting circuit including a first bipolar transistor having its base connected to said current source and to the emitters of the amplifier transistors, a second current source connected in circuit to supply current to the first bipolar transistor, and a multi-transistor circuit interconnecting the collector-emitter circuit of said bipolar transistor with the collectors of the amplifier transistors to limit the cumulative base-emitter voltages of the voltage limiting circuit and the amplifier transistors; a current mirror connecting to deliver base compensation current to the amplifier transistors; and a compensation circuit connected to drive the current mirror; the improvement comprising the provision of the compensation circuit as comprising:
- a compensation transistor which is matched with the amplifier transistors,
- a third current source connected to draw current through the emitter of the compensation transistor,
- a second bipolar transistor having its base-emitter circuit connected across the collector-emitter circuit of the compensation transistor,
- a fourth current source supplying current to the collector-emitter circuit of the second bipolar transistor and to the compensation transistor's collector and
- current mirror drive means connecting the base of the compensation transistor for driving the current mirror to deliver base compensation currents to the amplifier transistors,
- the amplifier and compensation transistors, the first, second, third and fourth current sources, and the first and second bipolar transistors being scaled so that the input base currents of the amplifier transistors are substantially compensated by current mirrored from the compensation circuit.

6. The input current compensation circuit of claim 5, wherein the magnitude of the fourth current source is greater than that of the third current source, thereby maintaining the second bipolar transistor in conduction.

7. The input current compensation circuit of claim 5, wherein the first, second, third and fourth current sources, the amplifier and compensation transistors, and the first and second bipolar transistors are scaled so that the base current of the compensation transistor drives the current mirror to deliver compensation currents to the amplifier transistors which are substantially equal to their input base currents.

8. The input current compensation circuit of claim 7, wherein said amplifier and compensation transistors comprise superbeta transistors.

9. The input current compensation circuit of claim 8, wherein the magnitude of the third current source is substantially half the magnitude of the first current source and the superbeta amplifier and compensation transistors are equally scaled, thereby causing each of the superbeta transistors to operate with substantially equal collector currents.

10. The input current compensation circuit of claim 8, wherein the first and second bipolar transistors are maintained conductive by the second and fourth current sources, respectively, and are mutually scaled so that the base-emitter voltage of the second bipolar transistor, and thereby the collector-emitter voltage of the superbeta compensation transistor, is kept substantially equal to the base-emitter voltage of the first bipolar transistor.

11. The input current compensation circuit of claim 10, wherein the transistors of the multi-transistor circuit in the voltage limiting circuit are scaled so that the collector-emitter voltages of the superbeta amplifier transistors are substantially equal to the base-emitter voltage of the first bipolar transistor, and thereby to the collector-emitter voltage of the superbeta compensation transistor.

12. The input current compensation circuit of claim 11, wherein the first and third current sources provide the superbeta amplifier and compensation transistors with substantially equal collector currents, said collector currents together with the substantially equal collector-emitter voltages forcing the base currents of the superbeta amplifier and compensation transistors to be substantially equal.

13. The input current compensation circuit of claim 12, wherein the first bipolar transistor is scaled to substantially twice the size of the second bipolar transistor, and the magnitude of the fourth current source exceeds that of the third current source by substantially half the magnitude of the second current source, whereby the base-emitter voltages of the two bipolar transistors are substantially equal and the collector current of the first bipolar transistors is substantially twice that of the second bipolar transistor, whereby the errors introduced by the bipolar transistors' base currents to the effective values of the first and third current sources substantially cancel.

14. The input current compensation circuit of claim 8, said current mirror drive means comprising a third bipolar transistor having its collector-emitter circuit connected in circuit between the current mirror and the base of the superbeta compensation transistor, and a fourth current source supplying base current to said third bipolar transistor.

15. The input current compensation circuit of claim 14, further comprising a fourth bipolar transistor having its collector-emitter circuit connected to the base of the third bipolar transistor and its base connected to the collector-emitter of the superbeta compensation transistor, said third and fourth bipolar transistors forming a feedback circuit to maintain the superbeta compensation transistor in its linear operating region.

16. The input current compensation circuit of claim 15, wherein the magnitudes of the third and fifth current sources are substantially equal, whereby the collector current of the fourth bipolar transistor is substantially equal to the magnitude of the third current source, and the error introduced by the base current of the fourth bipolar transistor adding to the effective magnitude of the third current source substantially cancels the error in the mirror drive current introduced by the third bipolar transistor's base current.

* * * * *